US008120981B2

(12) United States Patent
Kobayashi (10) Patent No.: US 8,120,981 B2
(45) Date of Patent: Feb. 21, 2012

(54) SEMICONDUCTOR INTEGRATED CIRCUIT DEVICE WITH FUSE ELEMENTS AND CONTROL METHOD THEREFORE

(75) Inventor: Tomohiro Kobayashi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 240 days.

(21) Appl. No.: 12/555,031

(22) Filed: Sep. 8, 2009

(65) Prior Publication Data

US 2010/0157648 A1    Jun. 24, 2010

(30) Foreign Application Priority Data

Dec. 18, 2008 (JP) ................................. 2008-322518

(51) Int. Cl.
*G11C 17/18* (2006.01)
(52) U.S. Cl. ............... 365/225.7; 365/96; 365/189.12; 365/205; 365/221
(58) Field of Classification Search .......... 365/96, 365/225.7, 233.1, 200, 189.05, 189.12, 205, 365/221
See application file for complete search history.

(56) References Cited

U.S. PATENT DOCUMENTS

| 7,254,079 | B2* | 8/2007 | Sumi et al. | 365/225.7 |
| 7,397,720 | B2* | 7/2008 | Sumi et al. | 365/225.7 |
| 7,688,664 | B2* | 3/2010 | Yamaguchi | 365/225.7 |
| 2005/0013187 | A1* | 1/2005 | Anand et al. | 365/225.7 |
| 2007/0058411 | A1 | 3/2007 | Shinichi et al. | |
| 2008/0036527 | A1* | 2/2008 | Nishihara et al. | 327/525 |

FOREIGN PATENT DOCUMENTS

JP    2007-048394    2/2007

OTHER PUBLICATIONS

Kim et al, Three-Transistor One-Time Programmable (OTP) ROM Cell Array Using Standard CMOS Gate Oxide Antifuse, IEEE Electron Device Letters, Sep. 2003, vol. 24, No. 9, pp. 589-591.

* cited by examiner

*Primary Examiner* — Pho M Luu
*Assistant Examiner* — Thao Bui
(74) *Attorney, Agent, or Firm* — Turocy & Watson, LLP (57) ABSTRACT

A semiconductor integrated circuit device includes a first block, a second block, and a control section. The first block includes a first fuse, a first switching configured to write data to the first fuse, a first holding portion capable of holding a first instruction, and a first instruction portion configured to turn on the first switching when a second instruction is given thereto with the first instruction. The second block includes a second fuse, a second switching configured to write data to the second fuse, a second holding portion capable of holding the first instruction, and a second instruction portion configured to turn on the second switching when the second instruction is given thereto with the first instruction. The control section issues the second instruction at a point in time when the first instruction is held in the first and second holding portions.

11 Claims, 6 Drawing Sheets

SEMICONDUCTOR INTEGRATED CIRCUIT DEVICE WITH FUSE ELEMENTS AND CONTROL METHOD THEREFORE

CROSS-REFERENCE TO RELATED APPLICATIONS

This application is based upon and claims the benefit of priority from prior Japanese Patent Application No. 2008-322518, filed Dec. 18, 2008, the entire contents of which are incorporated herein by reference.

BACKGROUND OF THE INVENTION

1. Field of the Invention

The present invention relates to a semiconductor integrated circuit device, in which data is written to one-time programmable (OTP) memory elements welded by electric current, and a control method therefore.

2. Description of the Related Art

The number of electrical fuse elements used in a system LSI mounted with memory elements is assumed to be several hundred to 1,000. If data is programmed in a plurality of fuses in one write processing cycle, a required current value increases. Thus, a circuit is needed to supply current for programming. Even if programs are simultaneously executed for a plurality of electrical fuse elements, moreover, there are inevitable differences in programming time between the fuse elements.

Thus, the values of currents that flow individually through the electrical fuse elements must be controlled, and this control is laborious. As described in Japanese Patent No. 2007-48394, to overcome this, there is a method in which electrical fuse elements mounted in an LSI are programmed one after another.

BRIEF SUMMARY OF THE INVENTION

A semiconductor integrated circuit device according to aspect of the present invention includes, a first functional block including a first fuse element, a first switching circuit configured to write data to the first fuse element when turned on, a first holding portion capable of holding a first write instruction transferred synchronously with a clock, and a first instruction portion configured to turn on the first switching circuit when a second write instruction is given thereto with the first write instruction held in the first holding portion;

a second functional block including a second fuse element, a second switching circuit configured to write data to the second fuse element when turned on, a second holding portion capable of holding the first write instruction transferred from the first holding portion in synchronism with a clock, and a second instruction portion configured to turn on the second switching circuit when the second write instruction is given thereto with the first write instruction held in the second holding portion; and a control section which issues the second write instruction at a point in time when the first write instruction is held in the first and second holding portions as the data are written to the first and second fuse elements.

The method of control a semiconductor integrated circuit device, the device including functional blocks for individually controlling fuse elements, the functional blocks individually including holding circuits capable of holding a first write instruction, the holding circuits being connected in series, the method according to aspect of the present invention, causing each of the functional blocks to sequentially transfer the first write instruction in synchronism with a clock signal;

causing a control section to output a second write instruction to the functional block corresponding to any of the fuse elements to be an object of writing at a point in time when the first write instruction is transferred to the holding circuit of the corresponding functional block; and causing the functional block given both the first and second write instructions to write data to the corresponding fuse element.

DETAILED DESCRIPTION OF THE INVENTION

Embodiments of this invention will now be described with reference to the accompanying drawings. In the description to follow, like reference numbers designate common portions throughout the several views.

First Embodiment

The following is a description of a semiconductor integrated circuit device according to a first embodiment of the invention and a memory system provided with the same. The present embodiment, as described below, is based on a configuration (hereinafter referred to as the program control circuit) for controlling programs for electrical fuse elements that function as OTP elements.

<Configuration of Program Control Circuit>

Figure 1:
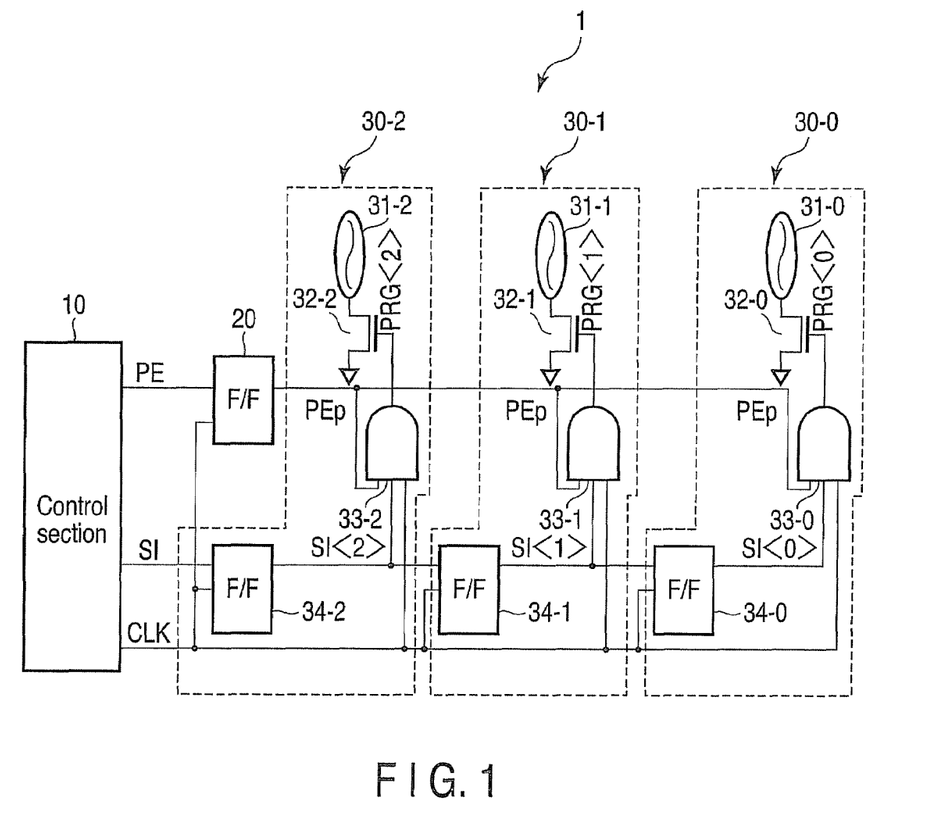
FIG. 1 is a block diagram of a program control circuit according to a first embodiment of the invention.

The program control circuit according to the present embodiment will be described with reference to FIG. 1. The circuit shown in FIG. 1 is provided with electrical fuse elements that relieve memory cells for three bits when a memory is flawed, for example. As shown in FIG. 1, a program control circuit 1 is provided with a control section 10, flip-flop 20, and three functional blocks 30-0 to 30-2.

The control section 10 outputs a write signal PE and signal SI to the flip-flop 20 and functional block 30-2, respectively, based on a clock signal CLK, in order to execute programs for respective electrical fuse elements of the functional blocks 30-0 to 30-2.

The flip-flop 20 latches the write signal PE in synchronism with the clock signal CLK and outputs it as a write signal PEp to the functional blocks 30-0 to 30-2.

The functional block 30-2 is provided with an electrical fuse element 31-2, MOS transistor 32-2, AND gate 33-2, and flip-flop 34-2. The electrical fuse element 31-2 is enabled to hold data and is energized when the data is programmed. One end (source) of the MOS transistor 32-2 is grounded to a current path, and the other end (drain) is connected to one end of the electrical fuse element 31-2. The fuse element 31-2 is programmed when the MOS transistor 32-2 is turned on. The flip-flop 34-2 latches signal SI from the control section 10 in synchronism with the clock signal CLK and transfers it as signal SI<2> to the AND gate 33-2 and functional block 30-1. The AND gate 33-2 performs an AND operation for the write signal PEp, signal SI<2>, and clock signal CLK. The result of the AND operation is output as signal PRG<2> to the gate of the MOS transistor 32-2. When signal PRG<2> goes high, therefore, the MOS transistor 32-2 is turned on, whereupon the electrical fuse element 31-2 is programmed.

The functional block 30-1 is provided with an electrical fuse element 31-1, MOS transistor 32-1, AND gate 33-1, and flip-flop 34-1. The electrical fuse element 31-1 is enabled to hold data and is energized when the data is programmed. One end (source) of the MOS transistor 32-1 is grounded to the current path, and the other end (drain) is connected to one end of the electrical fuse element 31-1. The fuse element 31-1 is programmed when the MOS transistor 32-1 is turned on. The flip-flop 34-1 latches signal SI<2> from the flip-flop 34-2 in synchronism with the clock signal CLK and transfers it as signal SI<1> to the AND gate 33-1 and functional block 30-0. The AND gate 33-1 performs an AND operation for the write signal PEp, signal SI<1>, and clock signal CLK. The result of the AND operation is output as signal PRG<1> to the gate of the MOS transistor 32-1. When signal PRG<1> goes high, therefore, the MOS transistor 32-1 is turned on, whereupon the electrical fuse element 31-1 is programmed.

The functional block 30-0 is provided with an electrical fuse element 31-0, MOS transistor 32-0, AND gate 33-0, and flip-flop 34-0. The electrical fuse element 31-0 is enabled to hold data and is energized when the data is programmed. One end (source) of the MOS transistor 32-0 is grounded to the current path, and the other end is connected to one end of the electrical fuse element 31-0. The fuse element 31-0 is programmed when the MOS transistor 32-0 is turned on. The flip-flop 34-0 latches signal SI<1> from the flip-flop 34-1 in synchronism with the clock signal CLK and transfers it as signal SI<0> to the AND gate 33-0 and functional block 30-0. The AND gate 33-0 performs an AND operation for the write signal PEp, signal SI<0>, and clock signal CLK. The result of the AND operation is output as signal PRG<0> to the gate of the MOS transistor 32-0. When signal PRG<0> goes high, therefore, the MOS transistor 32-0 is turned on, so that the electrical fuse element 31-0 is programmed.

If the functional blocks 30-0 to 30-2 are not distinguished from one another, in the configuration described above, they will be collectively referred to as functional blocks 30. Likewise, if the electrical fuse elements 31-0 to 31-2, MOS transistors 32-0 to 32-2, AND gates 33-0 to 33-2, and flip-flops 34-0 to 34-2 are not discriminated from one another, they will be simply referred to as electrical fuse elements 31, MOS transistors 32, AND gates 33, and flip-flops 34, respectively.

<Operation of Program Control Circuit>

Figure 2:
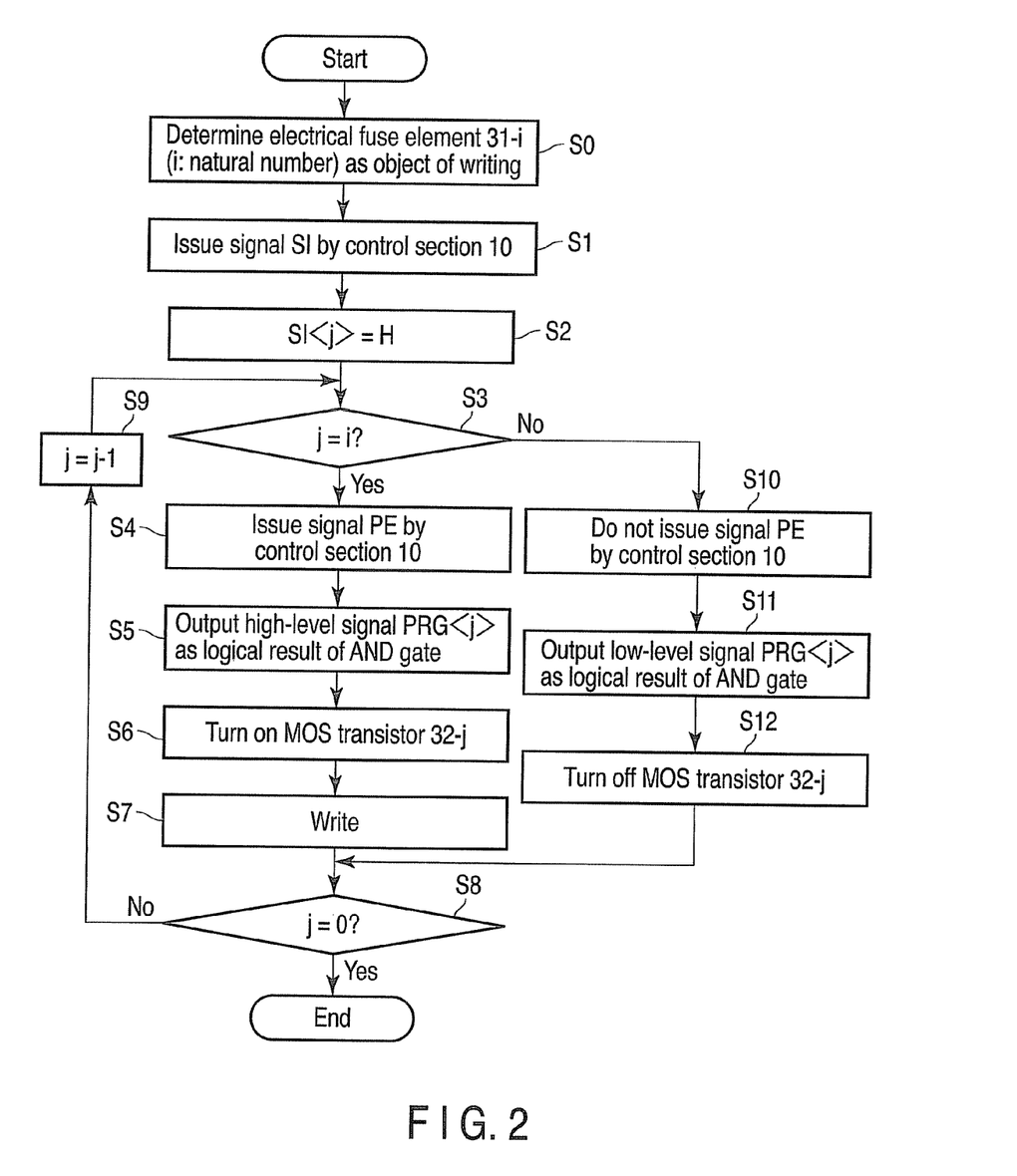
FIG. 2 is a flowchart showing the operation of the program control circuit according to the first embodiment.

A data write operation of the program control circuit according to the abovementioned present embodiment will now be described with reference to FIG. 2. FIG. 2 is a flowchart showing the operation of the program control circuit according to the present embodiment.

First, the control section 10 determines an electrical fuse element 31-$i$ ($i$=0, 1 or 2) as an object of writing (Step S0) and issues signal SI to the flip-flop 34-2 (S1). When signal SI is issued, signal SI<$j$> goes high in synchronism with the clock signal CLK (S2). However, the initial value of $j$ immediately after the issue of signal SI is 2.

If $j$=$i$, that is, if signal SI<$j$> input to a functional block to be programmed is high level (YES in S3), in this case, the control section 10 issues the write signal PE to the flip-flop 20 with a timing such that the write signal PEp goes high during a period in which a flip-flop 34-$i$ holds signal SI<$j$> (S4).

Thereupon, an AND gate 33-$i$ makes signal PRG<$j$> high level (S5). Thus, a MOS transistor 32-$j$ is turned on (S6), so that a current flows through the electrical fuse element 31-$i$, and programming is performed (S7).

Then, the control section 10 checks the value of $j$. If $j$=0 (YES in S8), writing to the electrical fuse elements is terminated.

If the value of $j$ is not 0 (NO in S8), 1 is subtracted from $j$ (S9), and the aforementioned processing of Step S2 and the subsequent steps is repeated so that $j$=0 is obtained.

If it is concluded in Step S3 that $j \ne i$, that is, if signal SI<$j$> input to a functional block not to be programmed is high level (NO in S3), the control section 10 does not issue the write signal PE (S10), that is, PE is low level. Thereupon, an AND gate 33-$j$ makes signal PRG<$j$> low level (S11). Thus, the MOS transistor 32-$j$ is turned off (S12), so that the electrical fuse element 31-$j$ is not programmed. Thereafter, the process of Step S8 is executed by the control section 10 (S8).

Figure 3:
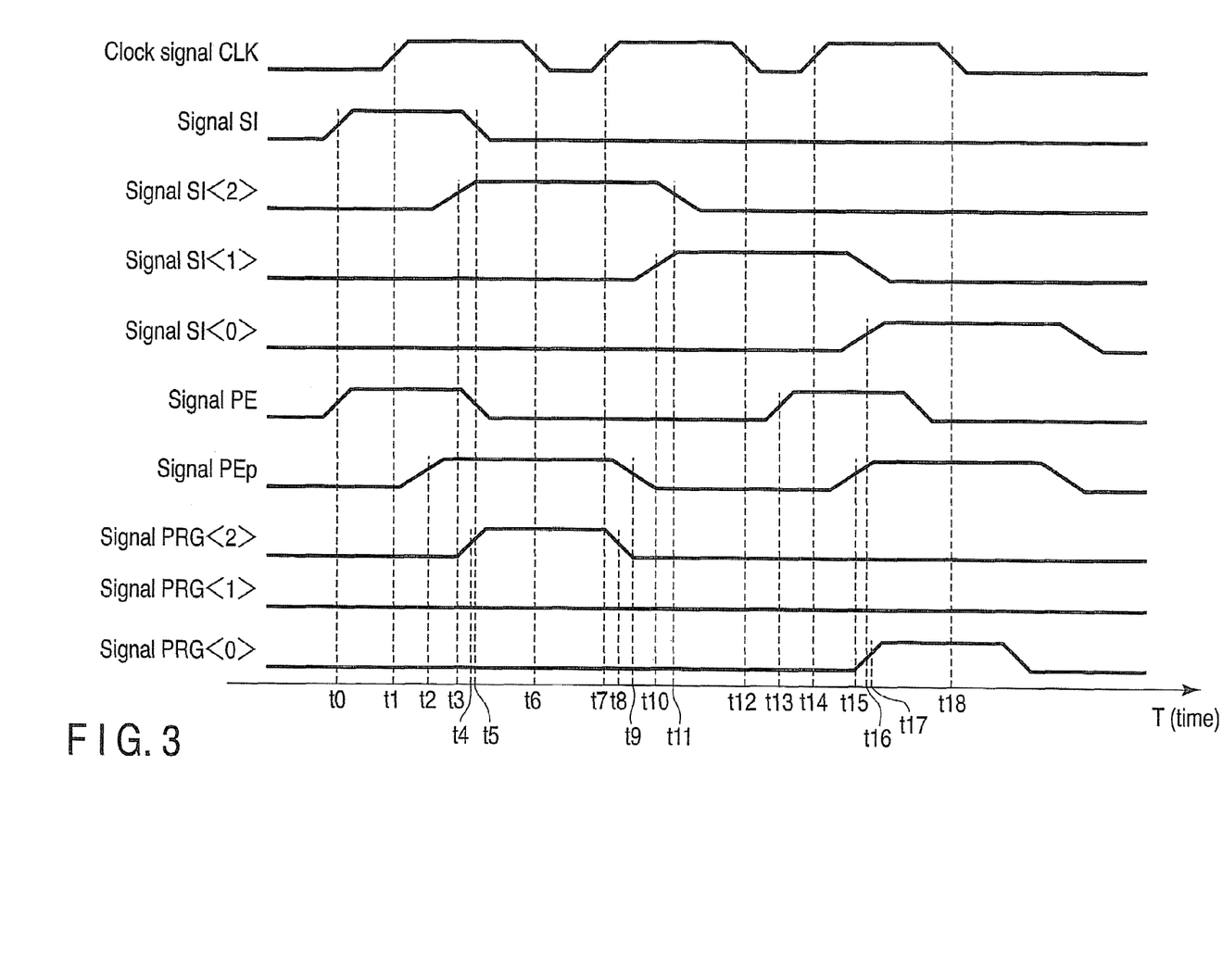
FIG. 3 is a time chart showing various signals in the program control circuit according to the first embodiment.

A specific example of this processing will be described with reference to FIG. 3. FIG. 3 is a time chart showing the clock signal CLK and signals SI, SI<0> to SI<2>, PE, PEp, and PRG<0> to PRG<2>.

In the following example, programming is performed for the electrical fuse elements 31-0 to 31-2. The electrical fuse element 31-0 is first programmed, the electrical fuse element 31-1 is then subjected to non-programmable processing, and the electrical fuse element 31-2 is finally programmed.

<Processing for Electrical Fuse Element 31-2>

First, the electrical fuse element 31-2 is programmed (S0). At time t0 when the clock signal CLK is low level, signal SI and write signal PE are individually high level (S1 and S4). When the clock signal CLK goes high at time t1, the high level signals SI and PE are latched by the flip-flops 34-2 and 20, respectively.

Thus, signals PEp and SI<2> go high at times t2 and t3, respectively (S2). The control section 10 issues signals SI and PE while the clock signal CLK is low level, in order to secure setup periods for the flip-flops 34-2 and 20. Consequently, signal PRG<2> goes high at time t4 (S5).

Thus, the MOS transistor 32-2 is turned on (S6), so that a current flows through the electrical fuse element 31-2, and programming for the fuse element 31-2 is performed (S7).

Then, the control section 10 makes signals SI and PE low-level at time t5. At time t6, thereafter, the clock signal CLK goes low. When the clock signal CLK goes high at time t7, signals PRG<2> and PEp go low at times t8 and t9, respectively.

<Processing for Electrical Fuse Element 31-1>

Then, the electrical fuse element 31-1 is subjected to non-programmable processing. When the clock signal CLK goes high at time t7, the high-level signal SI<2> is latched by the flip-flop 34-1. Consequently, signal SI<1> goes high at time t10.

Since the electrical fuse element 31-1 is not programmed, the control section 10 keeps signal PE low level (S10). Consequently, signal PRG<1> is low while signal SI<1> is low level (S11). Thereupon, the MOS transistor 32-1 remains off (S12). Thus, no current flows through the fuse element 31-1, so that no program is executed.

<Processing for Electrical Fuse Element 31-0>

Then, the electrical fuse element 31-0 is programmed. Subsequently, at time t13 when the clock signal CLK is low level, the control section 10 makes the write signal PE high level (S4). When the clock signal CLK then goes high at time t14, the high-level signal SI<1> is latched by the flip-flop 34-0. Consequently, signal SI<0> goes high at time t16 (S2). When the clock signal CLK goes high at time t14, moreover, the high-level signal PE is latched by the flip-flop 20.

Thus, signal PEp goes high at time t15. Consequently, signal PRG<0> goes high at time t17 (S5).

Thus, the MOS transistor 32-0 is turned on (S6), so that a current flows through the electrical fuse element 31-0, and programming for the fuse element 31-0 is completed (S7).

<Effect According to Present Embodiment>

With the program control circuit according to the present embodiment, the circuit scale can be reduced. The following is a description of an effect according to the present embodiment.

In the program control circuit 1, the flip-flops 34 are connected in a serial chain such that signal SI from the control section 10 can be sequentially transferred to the functional blocks 30-0 to 30-2. The write signal PEp is made high level when any of signals SI<0> to SI<2> output from the flip-flop 34 corresponding to the electrical fuse element to be programmed is high level. In other words, the control section 10 issues the write signal PEp so that it is high level at this time.

Thus, each of the functional blocks 30-0 to 30-2 does not need to have information on whether or not it is an object of writing. Further, each functional block is not expected to hold information on the timing for the programming of its electrical fuse element 31 either. Thus, the circuit scale can be reduced.

Second Embodiment

The following is a description of a semiconductor integrated circuit device according to a second embodiment of the invention. In the present embodiment, the non-programmable processing according to the first embodiment for electrical fuse elements that are not to be programmed is omitted.

<Configuration of Program Control Circuit>

Figure 4:
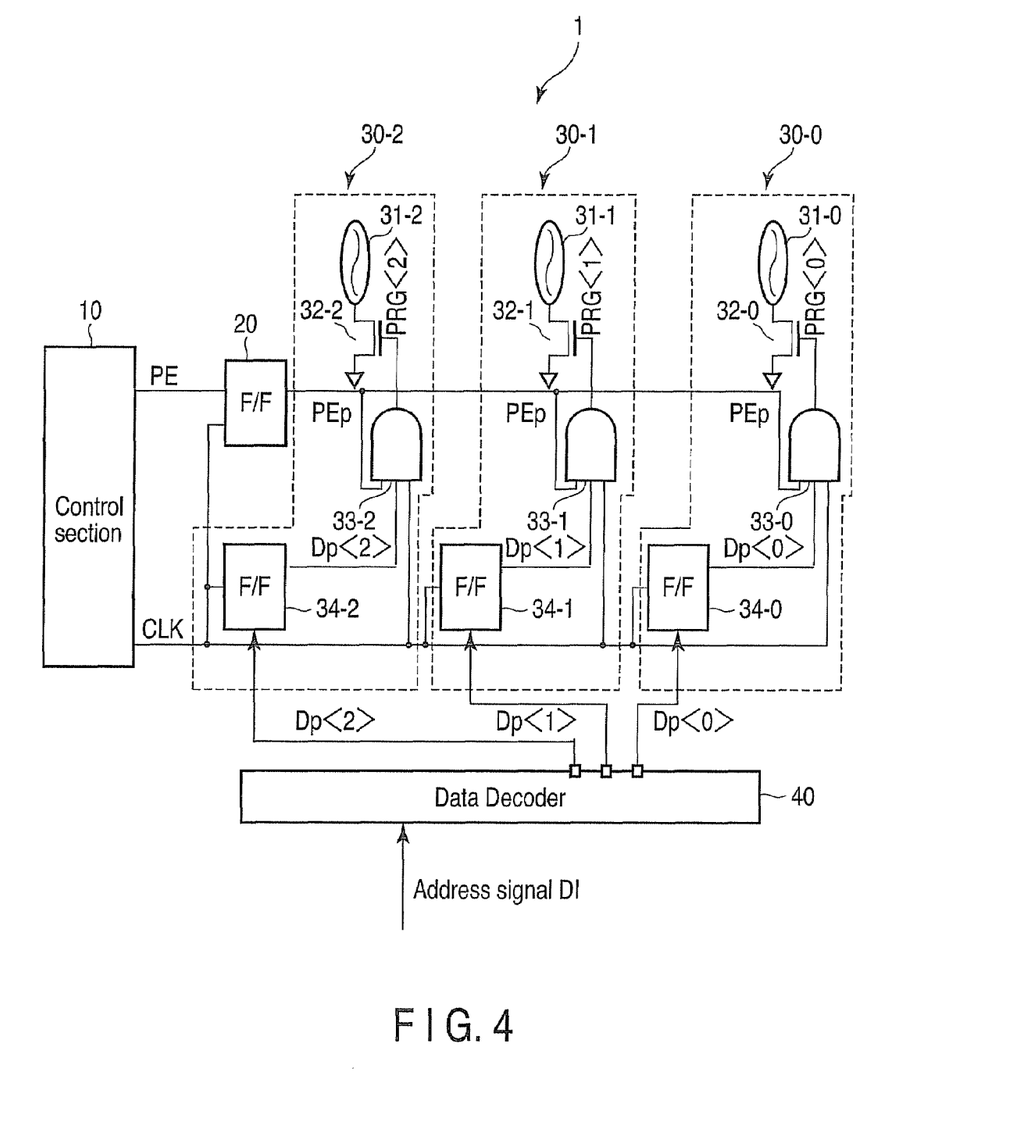
FIG. 4 is a block diagram of a program control circuit according to a second embodiment of the invention.

FIG. 4 is a block diagram of a program control circuit according to the present embodiment. As shown in FIG. 4, a program control circuit 1 of the present embodiment is further provided with a data decoder 40 added to the configuration of FIG. 1 described in connection with the first embodiment.

The data decoder 40 receives an address signal DI of a memory cell to be relieved from, for example, a controller (not shown). The decoder 40 decodes signal DI and supplies the result of this decoding as signal Dp<i> to functional blocks 30-0 to 30-2. More specifically, signal Dp<i> is supplied (or asserted) to a flip-flop 34-i corresponding to an electrical fuse element 31-i to be programmed. If a plurality of electrical fuse elements 31-i are to be programmed, in this case, signals Dp<i> are supplied individually to flip-flops 34-i with staggered timing. Thus, in each period of a clock signal CLK, only one of signals Dp<0> to Dp<2> goes high.

Further, a control section 10 does not issue signal SI. Flip-flops 34-0 to 34-2 receive signals Dp<0> to Dp<2> and output them to AND gates 33-0 to 33-2, respectively.

The AND gates 33-0 to 33-2 individually perform AND operations for signal PEp, signals Dp<0> to Dp<2>, and clock signal CLK. The results of the AND operations are output as signals PRG<0> to PRG<2>. Other configurations are the same as those of the first embodiment.

<Operation of Program Control Circuit>

Figure 5:
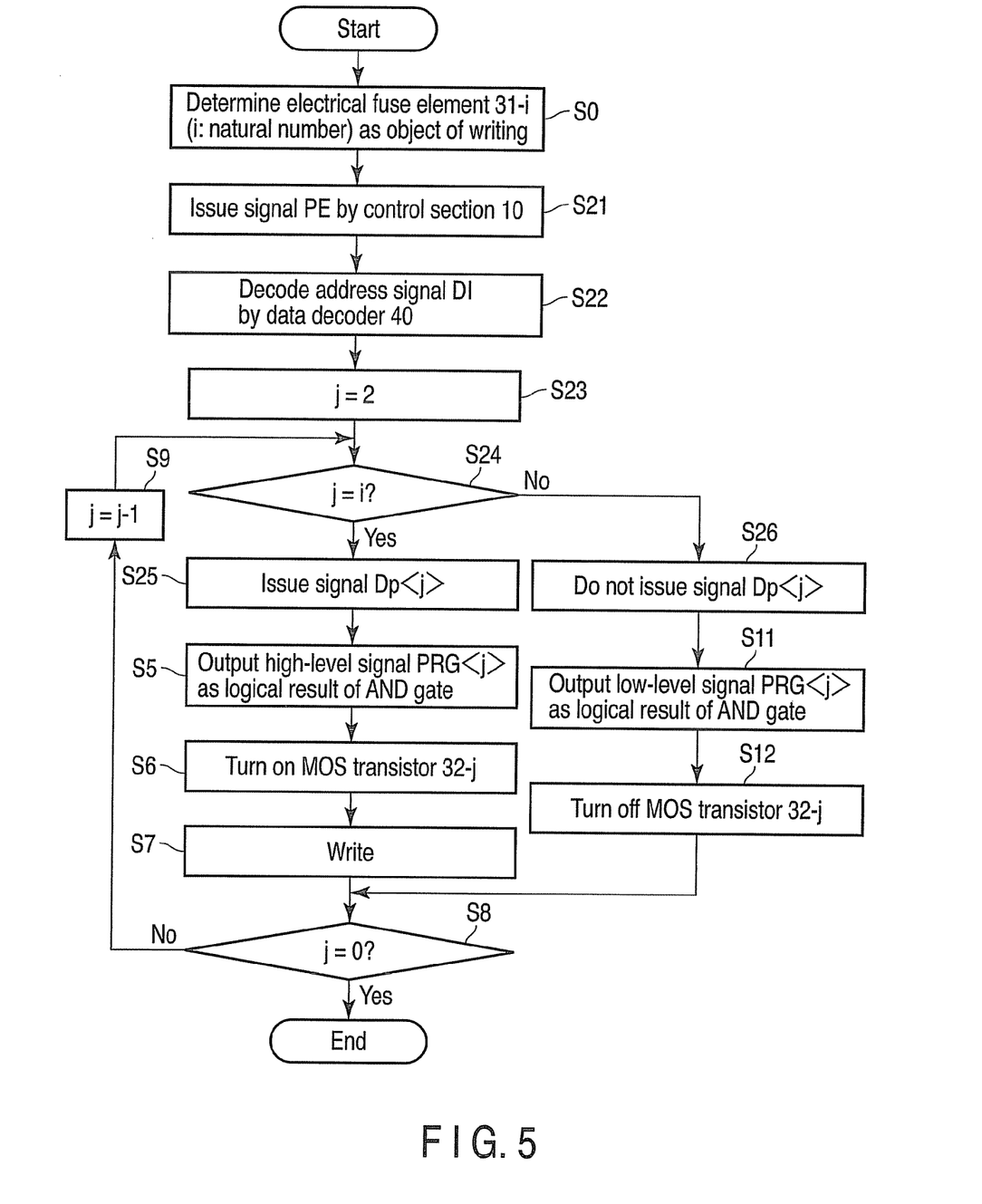
FIG. 5 is a flowchart showing the operation of the program control circuit according to the second embodiment.

A data write operation of the program control circuit according to the abovementioned present embodiment will now be described with reference to FIG. 5. FIG. 5 is a flowchart showing the operation of the program control circuit according to the present embodiment.

First, the control section 10 determines (Step S0) the electrical fuse element 31-i (i=0, 1 or 2) as an object of writing (Step S0) and issues a write signal PE to the flip-flop 20 (S21). Then, the data decoder 40 decodes an externally received address signal DI (S22). Further, the data decoder 40 executes write processing for the electrical fuse elements 31-2 to 31-0 in the order named, so that the control section 10 concludes that j=2 (S23). Thus, if there are a plurality of objects for which signals Dp<i> are issued, signals Dp<i> are sequentially issued starting from the side of the electrical fuse element 31-2. Thereupon, the data decoder 40 sequentially notices the functional blocks 30, starting with the one nearest to the control section 10. The functional block 30 that is noticed by the data decoder 40 will be referred to as the functional block 30-j. Thus, the initial value of j is 2.

If j=i, that is, if the functional block 30-j is a functional block to be programmed (YES in S24), in this case, the data decoder 40 issues signal Dp<j>. Specifically, signal Dp<j> is assumed to be high level.

Thereupon, an AND gate 33-i makes signal PRG<j> high level (S5). Thus, a MOS transistor 32-j is turned on (S6), so that a current flows through the electrical fuse element 31-i, and programming is performed (S7).

Then, the control section 10 checks the value of j. If j=0 (YES in S8), writing to the electrical fuse elements is terminated.

If the value of j is not 0 (NO in S8), 1 is subtracted from j (S9), and the aforementioned processing of Step S24 and the subsequent steps is repeated so that j=0 is obtained.

If it is concluded in Step S24 that j≠i (NO in S24), that is, if the functional block is not one to be programmed, the data decoder 40 does not issue signal Dp<j>, that is, signal Dp<j> is low level (S26). Thereupon, an AND gate 33-j makes signal PRG<j> low level (S11). Thus, the MOS transistor 32-j is turned off (S12), so that an electrical fuse element 31-j is not programmed. Thereafter, the process of Step S8 is executed by the control section 10 (S8).

Figure 6:
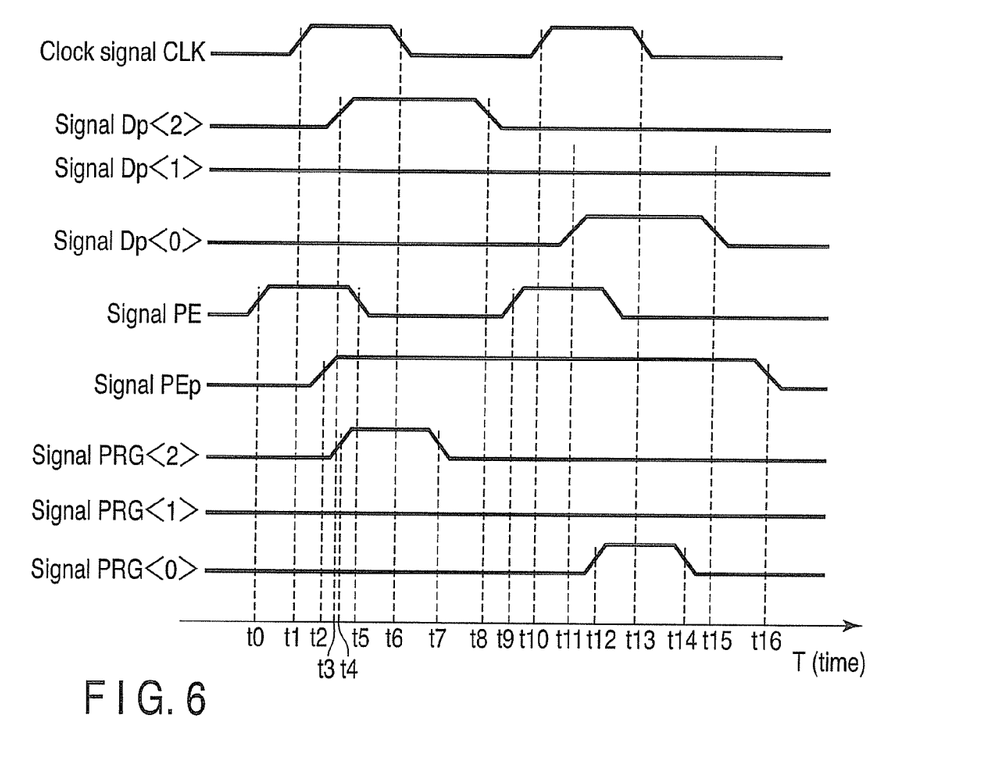
FIG. 6 is a time chart showing various signals in the program control circuit according to the second embodiment.

A specific example of this processing will be described with reference to FIG. 6. FIG. 6 is a time chart showing the clock signal CLK and signals Dp<0> to Dp<2>, PE, PEp, and PRG<0> to PRG<2>. In FIG. 6, signals Dp<0> to Dp<2> are signals that are output from the flip-flops 34-0 to 34-2 to AND gates 33-0 to 33-2.

In the following example, programming is performed for the electrical fuse elements 31-0 and 31-2. Programming is first performed for the electrical fuse element 31-0 and then for the electrical fuse element 31-2.

<Processing for Electrical Fuse Element 31-2>

First, the electrical fuse element 31-2 is programmed (S0). At time t0 when the clock signal CLK is low level, the control section 10 first makes the write signal PE high level (S21). When the clock signal CLK goes high at time t1, the write signal PE is latched by the flip-flop 20, and signal PEp goes high at time t2.

At time t3 in a period during which the clock signal CLK is high-level, thereafter, the flip-flop 34-2 issues signal Dp<2> from the data decoder 40 to the AND gate 33-2, regarding signal as being high level (S25).

Consequently, signal PRG<2> goes high at time t4 (S5). Thus, a MOS transistor 32-2 is turned on (S6), so that a current flows through the electrical fuse element 31-2, and programming for the fuse element 31-2 is performed (S7).

At time t5, moreover, the control section 10 makes write signal PE low level. When the clock signal CLK goes low at time t6, thereafter, signal PRG<2> goes low at time t7. At time t8, the data decoder 40 makes signal Dp<2> low level. Then, at time t9 in a period during which the clock signal CLK is low level, the control section 10 makes the write signal PE high level (S21). When the clock signal CLK goes high at time t10, the write signal PE is latched by the flip-flop 20. Thus, the write signal PEp continually maintains high level from time t0 onward.

<Processing for Electrical Fuse Element 31-0>

Then, the electrical fuse element 31-0 is programmed. At time t11 in a period during which the clock signal CLK is high level, the flip-flop 34-0 makes signal Dp<0> to be issued to the AND gate 33-0 high level (S25).

Consequently, signal PRG<0> goes high at time t12 (S5). Thereupon, the AND gate 33-0 makes signal PRG<0> high level and outputs it to the gate of the MOS transistor 32-0. Thus, the MOS transistor 32-2 is turned on (S6), so that a current flows through the electrical fuse element 31-2, and programming for the fuse element 31-2 is performed (S7).

Since signal Dp<1> is low level during the period from time to t0 time t16, signal PRG<1> is always low level. Thus, programming for the electrical fuse element 31-1 is not performed.

<Effect According to Present Embodiment>

In addition to the effect according to the first embodiment, with the program control circuit according to the present embodiment, there is an effect that programming time can be cut down. The following is a description of this effect.

In the present embodiment, the data decoder 40 issues signal Dp to only the flip-flop corresponding to the electrical fuse element to be programmed. In other words, signal Dp is not issued to any of the electrical fuse elements that are not be programmed. Thus, signal Dp is always low level.

In a programmable or non-programmable mode, therefore, the functional blocks 30 that require processing synchronous with the clock signal CLK should only be those which include the electrical fuse elements 31 to be programmed. In other words, the functional blocks that include no electrical fuse elements to be programmed do not require special processing. This is because programming is always inhibited with the low level signal Dp. Thus, the programming time can be cut down in proportion to the number of electrical fuse elements that are not to be programmed.

Figure 7:
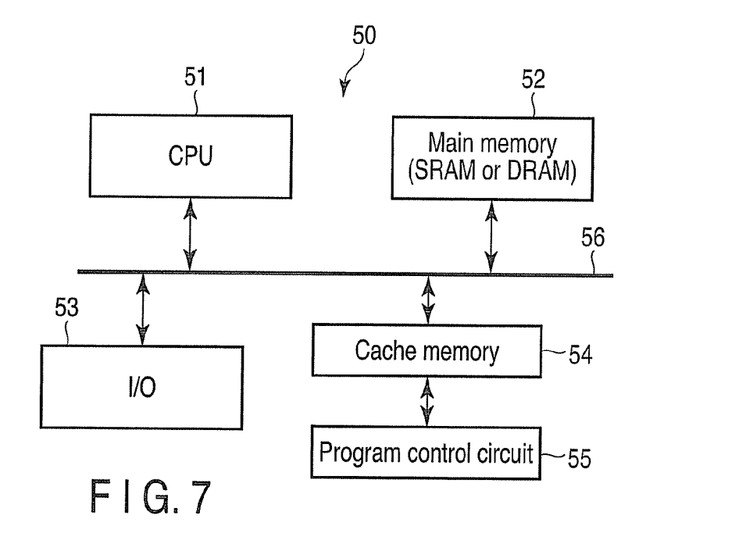
FIG. 7 is a block diagram of a memory system provided with the program control circuit according to the first and second embodiment.

The program control circuits according to the first and second embodiments can be used to relieve a cache in the memory system. This memory system will be described with reference to FIG. 7. FIG. 7 is a block diagram of the memory system.

As shown in FIG. 7, a memory system 50 is, for example, a computer that is provided with a CPU 51, main memory 52, cache memory 54, I/O terminal 53, program control circuit 55, and data bus 56.

The main memory 52 is a semiconductor memory, such as an SRAM or DRAM, which holds programs and data used in the CPU.

The cache memory 54 is also a semiconductor memory, such as an SRAM or DRAM, which temporarily holds programs and data stored in the main memory 52.

The CPU 51 performs computation based on the programs and data in the main memory 52 or cache memory 54.

The I/O terminal 53 accepts an external data input and outputs data and the result of the computation to the outside.

The data bus 56 connects the CPU 51, main memory 52, I/O terminal 53, and cache memory 54 so that data can be transferred between them.

The program control circuit 55 is identical with the program control circuit 1 described in connection with each of the first and second embodiments. In the program control circuit 55, the electrical fuse elements 31 are loaded with the addresses of defective cells in the cache memory 54.

Figure 8:
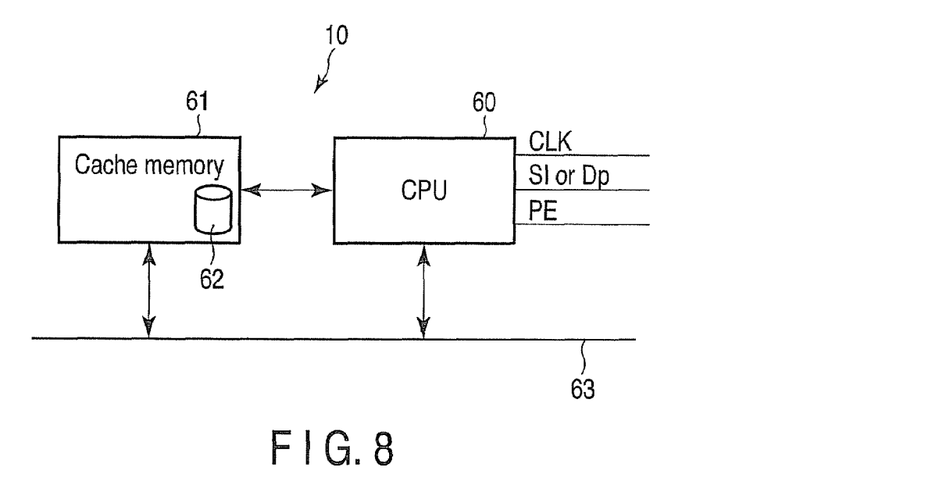
FIG. 8 is a block diagram of the program control circuit according to the first and second embodiment.

In the configuration of FIG. 7, moreover, the function of the control section 10 (and data decoder 40) in the program control circuit 1 may be assigned to the CPU and cache memory. This aspect will be described with reference to FIG. 8. FIG. 8 is a block diagram of the control section 10 described in connection with each of the first and second embodiments.

As shown in FIG. 8, the control section 10 is provided with a cache memory 61, CPU 60, and data bus 63. Further, the cache memory 61 is provided with a program 62, which determines the issue timings of the signals described in connection with each of the first and second embodiments.

According to the first embodiment, for example, the cache memory 61 temporarily holds the program 62 that determines the respective issue timings of the clock signal CLK, signal SI, and write signal PE. This program includes information on defective memory cells, that is, on the electrical fuse elements 31 to be programmed. By performing the computation after reading this program from the cache memory 61, the CPU 60 issues the clock signal CLK, signal SI, and write signal PE with the timings shown in FIG. 3.

According to the second embodiment, on the other hand, the cache memory 61 holds the program that determines the respective issue timings of the clock signal CLK, signal Dp, and write signal PE. This program also includes information on defective memory cells. By performing the computation after reading this program from the cache memory 61, the CPU 60 issues the clock signal CLK, signal Dp, and write signal PE with the timings shown in FIG. 6.

In the program control circuit according to the first embodiment, in particular, the programs are successively executed in synchronism with the clock signal CLK for all the functional blocks 30-0 to 30-2. In consideration of this point, the program control circuit is effective for the case where the size of a memory to be relieved is as small as, for example, 128 bits (or 16 bytes).

Although the program control circuits according to the first and second embodiments have been described as being configured to relieve defective memory cells for three bits, moreover, it may alternatively be configured to relieve defectives for four or more bits. In other words, the number of functional blocks may be increased depending on the number of bits that should be relieved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
  a first functional block including a first fuse element, a first switching circuit configured to write data to the first fuse element when turned on, a first holding portion capable of holding a first write instruction transferred synchronously with a clock, and a first instruction portion configured to turn on the first switching circuit when a second write instruction is given thereto with the first write instruction held in the first holding portion;

a second functional block including a second fuse element, a second switching circuit configured to write data to the second fuse element when turned on, a second holding portion capable of holding the first write instruction transferred from the first holding portion in synchronism with the clock, and a second instruction portion configured to turn on the second switching circuit when the second write instruction is given thereto with the first write instruction held in the second holding portion; and a control section which issues the second write instruction at a point in time when the first write instruction is held in the first and second holding portions as the data are written to the first and second fuse elements, wherein the first and second switching circuits each include a MOS transistor, one end of a current path of which is connected to the first or second fuse element and the other end of which is grounded, the first and second instruction portions individually include arithmetic circuits which compute the first and second write instructions and each apply a voltage higher than a threshold value of each said MOS transistor to a gate of the MOS transistor based on a result of the computation, and the first and second holding portions each include a flip-flop which holds the first write instruction.

2. The device according to claim 1, wherein the arithmetic circuits each apply the voltage higher than the threshold value of the MOS transistor to the gate of the MOS transistor when each of the first and second write instructions is assumed to be high level.

3. The device according to claim 2, wherein the arithmetic circuits are AND gates.

4. The device according to claim 1, wherein the control section includes a program which determines an issue timing of the second write instruction and a processor which executes the program to issue the second write instruction while the first write instruction is held in the first or second holding portion corresponding to the first or second functional block to be an object of writing.

5. The device according to claim 4, wherein the first and second holding portions each include a flip-flop.

6. A memory system comprising:
a main memory capable of holding data;
a cache memory capable of temporarily holding the data in the main memory;
a CPU which performs processing by means of the data held in the cache memory; and
a semiconductor integrated circuit device which relieves a memory cell in the cache memory,
the first and second fuse elements being configured to hold defective information on the memory cell,
wherein the semiconductor integrated circuit devices comprises:
a first functional block including a first fuse element, a first switching circuit configured to write data to the first fuse element when turned on, a first holding portion capable of holding a first write instruction transferred synchronously with a clock, and a first instruction portion configured to turn on the first switching circuit when a second write instruction is given thereto with the first write instruction held in the first holding portion;
a second functional block including a second fuse element, a second switching circuit configured to write data to the second fuse element when turned on, a second holding portion capable of holding the first write instruction transferred from the first holding portion in synchronism with frail the clock, and a second instruction portion configured to turn on the second switching circuit when the second write instruction is given thereto with the first write instruction held in the second holding portion; and
a control section which issues the second write instruction at a point in time when the first write instruction is held in the first and second holding portions as the data are written to the first and second fuse elements.

7. A semiconductor integrated circuit device comprising:
a first functional block including a first fuse element, a first switching circuit configured to write data to the first fuse element when turned on, a first holding portion capable of holding a first write instruction transferred synchronously with a clock, and a first instruction portion configured to turn on the first switching circuit when a second write instruction is given thereto with the first write instruction held in the first holding portion;
a second functional block including a second fuse element, a second switching circuit configured to write data to the second fuse element when turned on, a second holding portion to which the first write instruction is transferred in synchronism with the clock, and a second instruction portion configured to turn on the second switching circuit when the second write instruction is given thereto with the first write instruction held in the second holding portion;
a decoder which issues the first write instruction only to the first and/or holding portion corresponding to at least one of the first and second fuse elements to be an object of writing with staggered timing; and
a control section which issues the second write instruction when the data are written to the first and second fuse elements,
wherein the first and second switching circuits each include a MOS transistor, one end of a current path of which is connected to the first or second fuse element and the other end of which is grounded, the first and second instruction portions individually include arithmetic circuits which compute the first and second write instructions and each apply a voltage higher than a threshold value of each said MOS transistor to a gate of the MOS transistor based on a result of the computation, and the first and second holding portions each include a flip-flop which holds the first write instruction.

8. The device according to claim 7, wherein the arithmetic circuits each apply the voltage higher than the threshold value of the MOS transistor to the gate of the MOS transistor when each of the first and second write instructions is assumed to be high level.

9. The device according to claim 8, wherein the arithmetic circuits are AND gates.

10. The device according to claim 7, wherein the control section includes a program which determines an issue timing of the second write instruction and a processor which executes the program to issue the second write instruction while the first write instruction is held in the first or second holding portion corresponding to the first or second functional block to be an object of writing.

11. The device according to claim 10, wherein the first and second holding portions each include a flip-flop.

* * * * *